United States Patent [19]

Noguchi

[11] Patent Number: 5,219,786
[45] Date of Patent: Jun. 15, 1993

[54] SEMICONDUCTOR LAYER ANNEALING METHOD USING EXCIMER LASER

[75] Inventor: Takashi Noguchi, Kanagawa, Japan

[73] Assignee: Sony Corporation, Tokyo, Japan

[21] Appl. No.: 897,089

[22] Filed: Jun. 11, 1992

[30] Foreign Application Priority Data

Jun. 12, 1991 [JP] Japan .................. 3-168783

[51] Int. Cl.$^5$ .................. H01L 21/306; H01L 21/326; B30B 5/02; B30B 15/34
[52] U.S. Cl. .................. 437/174; 156/583.2; 437/240; 437/247
[58] Field of Search .................. 437/174, 240, 247; 148/DIG. 3, DIG. 90

[56] References Cited

FOREIGN PATENT DOCUMENTS 2-294027  8/1920  Japan .................. 437/174

Primary Examiner—Olik Chaudhuri
Assistant Examiner—Ramamohan R. Paladugu
Attorney, Agent, or Firm—Hill, Steadman & Simpson

[57] ABSTRACT

A semiconductor layer annealing method comprises a step of heating a wafer consisting of a substrate and a semiconductor layer formed thereon by a heating means at a preheating temperature which will not exercise adverse thermal effect on the substrate, heating a portion of a small area of the semiconductor layer by a pulse of an excimer laser beam in one annealing cycle to a temperature higher than the preheating temperature and high enough to anneal the portion of the semiconductor layer, and repeating the annealing cycle to anneal the successive portions of the semiconductor layer sequentially. Since the semiconductor layer is preheated and the excimer laser beam needs only to raise the temperature of the semiconductor layer by a temperature far lower than the annealing temperature, the energy density of the excimer laser beam on the semiconductor layer may be smaller than that required by the prior art semiconductor layer annealing method and hence the area of a portion of the semiconductor layer which can be annealed by the semiconductor layer annealing method is greater than that can be annealed by the prior art semiconductor layer.

7 Claims, 2 Drawing Sheets

FIG. IA
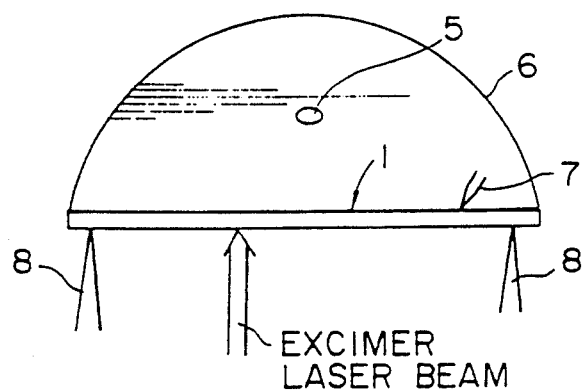
EXCIMER LASER BEAM
FIG. IB
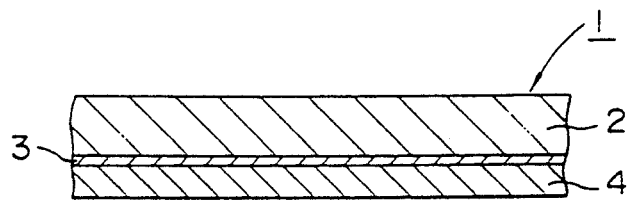
FIG. IC
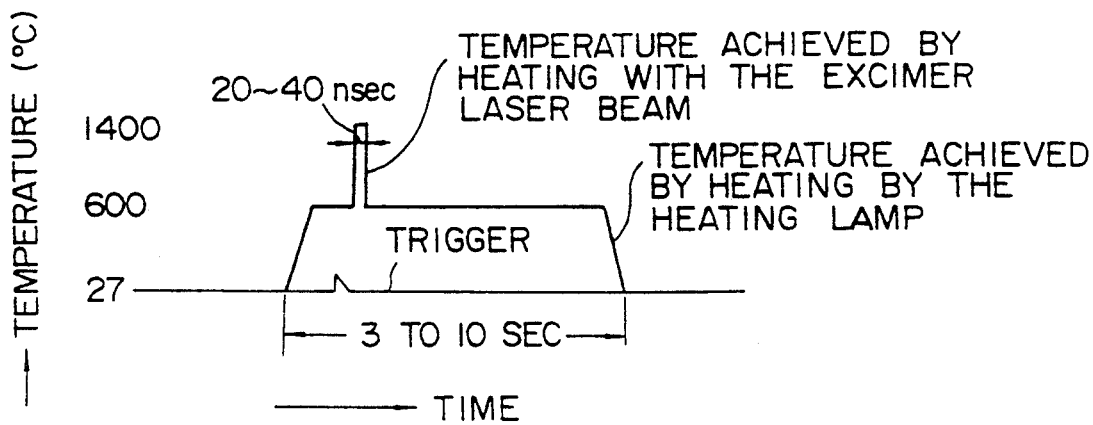

SEMICONDUCTOR LAYER ANNEALING METHOD USING EXCIMER LASER

BACKGROUND OF THE INVENTION

1. Field of the Invention

The present invention relates to a semiconductor layer annealing method and, more particularly, to a method of annealing a semiconductor layer, such as a silicon layer, formed on a substrate, such as a glass plate.

2. Description of the Prior Art

Most liquid crystal devices employ a substrate of low-melting glass having a softening point of 600° C. because low-melting glass is inexpensive. In fabricating a liquid crystal device employing a low-melting glass substrate, a very complex LSI circuit must be formed on the low-melting glass substrate. In forming a LSI circuit on the low-melting glass substrate, a semiconductor layer, such as a silicon layer, is formed on the low-melting glass substrate by, for example, a CVD process, and then the semiconductor layer must be annealed.

Generally, the semiconductor layer is annealed by a lamp annealing process, in which the semiconductor layer is heated at an annealing temperature on the order of 600° C. because it is possible that the low-melting glass substrate is deformed by heat if the annealing temperature is higher than 600° C. It is possible to form a LSI circuit on the semiconductor layer annealed at 600° C. and the characteristics of the semiconductor devices, such as transistors, of the LSI circuit are passable. However, an annealing temperature on the order of 600° C. is unable to prevent the creation of traps in the semiconductor layer and traps produced in the semiconductor layer cause restraints on the improvement of the semiconductor devices formed on the semiconductor layer. The semiconductor layer must be heated at a temperature in the range of 1200° C. to 1400° C. for perfect annealing.

An annealing method proposed in Japanese Patent Laid-open (Kokai) No. Hei 2-11452 employs an excimer laser beam for annealing. The excimer laser beam is able to heat only the semiconductor layer effectively without heating the substrate. However, the energy of a pulse of an excimer laser beam emitted by an excimer laser available in the market is as small as 1 J. Therefore, it is difficult to anneal a semiconductor layer having a relatively large area with the excimer laser beam because the excimer laser beam is able to anneal only a very small section of the semiconductor layer at at time and hence the annealing cycle must be repeated many times for many small sections of the semiconductor layer. Thus, the throughput of an annealing apparatus using the excimer laser beam for annealing is very small.

An attempt has been made to anneal a semiconductor layer by scanning the entire area of the semiconductor layer with an excimer laser beam. However, if the semiconductor layer is scanned with the excimer laser beam, the portions of the semiconductor layer on the scanning lines and those of the same between the scanning lines may be heated respectively at different temperatures. Thus, it is doubtful if the method of annealing a semiconductor layer by scanning the semiconductor layer with an excimer laser beam is practically applicable.

SUMMARY OF THE INVENTION

Accordingly, it is an object of the present invention to provide a semiconductor layer annealing method capable of sufficiently annealing a semiconductor layer formed on a substrate so that only few traps remain in the semiconductor layer at a high throughput without entailing adverse effect of heat on the substrate.

A semiconductor layer annealing method in one aspect of the present invention heats a semiconductor layer formed on a substrate with an excimer laser beam at a relatively high temperature while the substrate carrying the semiconductor layer is heated at a temperature that will not cause adverse effects on the substrate.

BRIEF DESCRIPTION OF THE DRAWINGS

The above and other objects, features and advantages of the present invention will become more apparent from the following description taken in connection with the accompanying drawings, in which:

FIGS. 1A, 1B and 1C are illustrations of assistance in explaining a semiconductor layer annealing method in a preferred embodiment according to the present invention, in which FIG. 1A is a sectional view of an annealing apparatus for carrying out the semiconductor layer annealing method, FIG. 1B is a sectional view of a wafer and FIG. 1C is a timing chart showing the timing of heating for annealing.

DETAILED DESCRIPTION OF THE PREFERRED EMBODIMENTS

Figure 2:
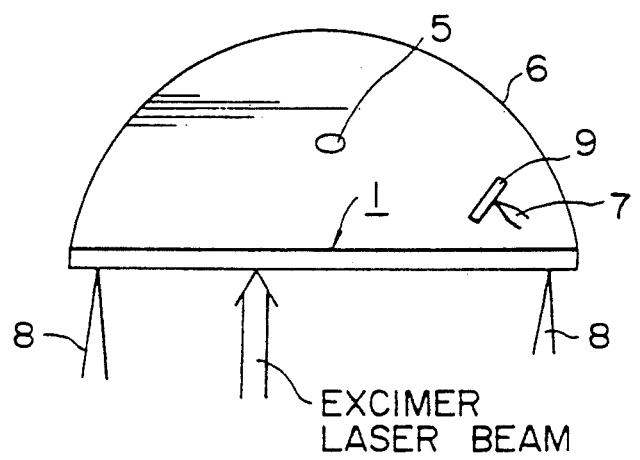
FIG. 2 is a sectional view of another annealing apparatus for carrying out the semiconductor layer annealing method of the present invention.

Referring to FIG. 1B, a wafer 1 has a low-melting glass substrate 2 having a softening point of 600° C., a $SiO_2$ buffer layer 3 formed on the low-melting glass substrate 2, and a polycrystalline sllicon layer 4 formed over the $SiO_2$ buffer layer 3. Although the $SiO_2$ buffer layer 3 is dispensable, it is preferable to form the $SiO_2$ buffer layer 3 over the surface of the low-melting glass substrate 2 to enable the polycrystalline silicon layer 4 to be heated effectively with an excimer laser beam without heating the low-melting glass substrate 2.

The wafer 1 is subjected to rapid thermal annealing (RTA) by an annealing apparatus capable of irradiating the wafer with an excimer laser beam.

Referring to FIG. 1A, the annealing apparatus has an arc lamp 5, a reflector 6 for reflecting the light emitted by the arc lamp 5 and traveling away from the wafer 1 toward the wafer 1, a temperature detector 7, such as a thermoelectric thermometer, for detecting the temperature of the wafer 1, quartz rods 8 for supporting the wafer 1, and an excimer laser, not shown. The luminous intensity of the arc lamp 5 is regulated on the basis of the temperature detected by the temperature detector 7 so that the wafer 1 is heated at a desired temperature, for example, 600° C. The wafer 1 is supported on the quartz rods 8 with the polycrystalline silicon layer 4 facing the excimer laser and with the low-melting glass substrate 2 facing the arc lamp 5.

A pulse excimer laser beam projected by the excimer laser from under the wafer 1 falls on the semiconductor silicon layer 4 to heat a portion of the polycrystalline silicon layer 4 of a predetermined small area at a time. The position of incidence of the pulse excimer laser beam is shifted gradually to irradiate the entire area of the polycrystalline silicon layer 4.

In annealing the polycrystalline silicon layer 4, the wafer 1 is heated at 600° C. by the arc lamp 5, and then the polycrystalline silicon layer 4 is irradiated with the pulse excimer laser beam. Since the wafer 1 is heated beforehand at 600° C., the polycrystalline silicon layer 4 is heated at, for example, 1400° C. when irradiated with the pulse excimer laser beam.

As shown in FIG. 1C, a trigger signal is given to the excimer laser to actuate the excimer laser when the wafer 1 is heated at 600° C. by the arc lamp 5. The pulse excimer laser beam is a XeCl laser beam having a wavelength of 307 nm or a KrF laser beam having a wavelength of 248 nm. The pulse width of the pulse excimer laser beam is in the range of 20 to 40 nsec and the maximum frequency of the pulse excimer laser beam is, for example, 300 pulses/sec. Several pulses of the pulse excimer laser beam may be applied to each portion of a predetermined small area of the polycrystalline silicon layer 4.

Thus, the polycrystalline silicon layer 4 is annealed satisfactorily without exercising adverse thermal effect on the low-melting glass substrate 4 by being effectively heated at a high temperature of 1400° C. for a very short time interval in the range of 20 to 40 nsec after heating the wafer 1 at 600° C., i.e., a temperature lower than the softening point of the low-melting glass substrate 2.

The absorption coefficient a (which, in general, is represented by $\alpha$) of silicon for light having a wavelength of 248 nm or 307 nm (ultraviolet radiation), such as XeCl laser light or KrF laser light, is $10^6$/cm, and the value of depth d meeting a condition expressed by: $I = I_0 \cdot e^{-ad} = I_0/e$ ($a \cdot d = 1$), where I is the intensity of light at the depth d in a silicon layer, $I_0$ is the intensity of light on the surface of the layer, and e is the base of the natural logarithms, is 100 Å. Accordingly, the excimer laser beam hardly penetrates the polycrystalline silicon layer 4 if the thickness of the polycrystalline silicon layer 4 is not less than 100 Å and hence the low-melting substrate 2 is barely heated.

Although the polycrystalline silicon layer 4 preheated at 600° C. is heated to the annealing temperature of 1400° C., the temperature of the polycrystalline silicon layer 4 needs to be raised only by 800° C. by the excimer laser beam. Accordingly, the energy density of the excimer laser beam may be $600\rho$ ($\rho$ is the specific heat of the polycrystalline silicon layer 4) less than that necessary for heating the same polycrystalline silicon layer 4 by the prior art annealing method, and hence the area of a portion of the polycrystalline silicon layer 4 which can be annealed by one pulse of the pulse excimer laser beam by the semiconductor layer annealing method of the present invention is greater than that of the same polycrystalline silicon layer 4 which can be annealed by one pulse of the pulse excimer laser beam by the prior art semiconductor layer annealing method.

Thus, the number of pulses of the pulse excimer laser beam required for annealing one wafer in annealing the semiconductor layer formed thereon by the semiconductor layer annealing method of the present invention is smaller than that required by the prior art semiconductor layer annealing method and, consequently, the present invention increases the throughput of the semiconductor layer annealing process.

If the polycrystalline silicon layer 4 is formed on a substrate having a softening point higher than that of the low-melting glass substrate 1, the substrate can be heated to a higher temperature by the arc lamp 5 and a portion of a wider area of the polycrystalline silicon layer 4 can be annealed by one pulse of the same pulse excimer laser beam. For example, if the polycrystalline silicon layer 4 is formed on a quartz substrate having a softening point of 1000° C., the quartz substrate and the polycrystalline silicon layer formed thereon may be heated beforehand to about 1000° C. and the pulse excimer laser beam needs to raise the temperature of the polycrystalline silicon layer 4 only by 400° C. Therefore, the area of a portion of the polycrystalline silicon layer 4 formed on the quartz substrate which can be annealed by one pulse of the pulse excimer laser beam is about twice the area of a portion of the polycrystalline silicon layer 4 formed on the low-melting glass substrate by one pulse of the same pulse excimer laser beam, and the throughput of the semiconductor layer annealing process will be doubled when the quartz substrate is used.

The semiconductor layer annealing method of the present invention is applicable also to annealing a semiconductor layer formed on a semiconductor substrate.

For example, in fabricating a SRAM having load MOSFETs formed in a polycrystalline silicon layer formed on a semiconductor substrate, the polycrystalline silicon layer must be annealed after the same has been formed by a CVD process so that the devices including the MOSFETs formed on the semiconductor substrate are not deteriorated. Therefore, the semiconductor substrate cannot be heated at a high temperature; the upper limit of the temperature is on the order of 600° C. However, the polycrystalline silicon layer in which the load MOSFETs are to be formed must be heated at 800° C. or above for effective annealing, which can be achieved by the semiconductor layer annealing method of the present invention. That is, the semiconductor substrate is heated at 600° C. by a heating lamp, and then the polycrystalline silicon layer is heated at 800° C. or above by the pulse excimer laser beam for annealing. The heating lamp may be an arc lamp or a halogen lamp.

Incidentally, the halogen lamp is not suitable for the preheating of a glass substrate because the halogen lamp emits light having a relatively long wavelength which a glass substrate cannot absorb. Therefore, the arc lamp is used for the preheating of the low-melting glass substrate.

If it is possible that the temperature measured by the temperature detector 7, i.e., the thermoelectric thermometer, does not coincide with the actual temperature of the substrate due to the direct irradiation of the temperature detector 7 by the light emitted by the arc lamp 5, a dummy substrate 9 of the same material as that of the substrate is disposed between the arc lamp 5 and the temperature detector 7 as shown in FIG. 2 so as to shield the temperature detector 7 from direct irradiation and the temperature of the dummy substrate 9 should be detected by the temperature detector 7 to monitor the temperature of the substrate correctly for the accurate control of the preheating of the substrate.

As is apparent from the foregoing description, the semiconductor layer annealing method of the present invention preheats a wafer consisting of a substrate and a semiconductor layer formed thereon by a heating lamp to a temperature which will not exercise adverse thermal effect on the substrate, and then only the semiconductor layer is heated further by an excimer laser beam to a temperature high enough for annealing in a very short time interval. Thus, the semiconductor substrate can be satisfactorily and efficiently annealed so that only few traps remain therein without exercising adverse thermal effect on the substrate and the throughput of the semiconductor layer annealing process can be increased.

Although the invention has been described in its preferred form with a certain degree of particularity, obviously many changes and variations are possible therein. It is therefore to be understood that the present invention may be practiced otherwise than as specifically described herein without departing from the spirit and scope thereof.

What is claimed is:

1. A method of annealing a semiconductor layer formed on a low temperature melting substrate, said method comprising steps of:

heating a wafer consisting of the low temperature melting substrate and the semiconductor layer formed thereon by a heating means to a desired preheating temperature which will not produce adverse thermal effects on the substrate;

detecting with a temperature detector when said wafer has reached said desired preheating temperature, then heating a portion of a small area of the semiconductor layer with a pulse of an excimer laser beam for one annealing cycle to a second temperature which is higher than said desired preheating temperature and said second temperature is high enough to anneal the portion of the semiconductor layer; and and successively sequentially repeating the heating of successive small area portions of the semiconductor layer so as to anneal them.

2. A method according to claim 1, wherein the heating means is an arc lamp.

3. A method according to claim 1, wherein the heating means is a halogen lamp.

4. A method according to claim 1, wherein the excimer laser beam is a XeCl laser beam.

5. A method according to claim 1, wherein the excimer laser beam is a KrF laser beam.

6. A method according to claim 1, wherein the pulse width of the pulse of the excimer laser beam is in the range of 20 to 40 nsec.

7. The method of claim 1 including the step of placing a dummy substrate formed of low temperature melting substrate between said heating means and said temperature detector so as to shield said temperature detector so as to monitor the temperature of said dummy substrate so as to correctly monitor the temperature of said substrate.

* * * * *